United States Patent
Lau et al.

(10) Patent No.: US 7,614,800 B2
(45) Date of Patent: Nov. 10, 2009

(54) FIDUCIAL MARKINGS FOR QUALITY VERIFICATION OF HIGH DENSITY CIRCUIT BOARD CONNECTORS

(75) Inventors: Edmond Warming Lau, Sunnyvale, CA (US); Xiaozhong Wang, Sunnyvale, CA (US); Robert Lewis Mosebar, San Jose, CA (US)

(73) Assignee: Emcore Corporation, Albuquerque, NM (US)

( * ) Notice: Subject to any disclaimer, the term of this patent is extended or adjusted under 35 U.S.C. 154(b) by 406 days.

(21) Appl. No.: 11/240,402

(22) Filed: Sep. 30, 2005

(65) Prior Publication Data

US 2007/0077012 A1     Apr. 5, 2007

(51) Int. Cl.
  *G02B 6/42*  (2006.01)
  *H05K 7/06*  (2006.01)
(52) U.S. Cl. ..................................... 385/92; 361/777
(58) Field of Classification Search ............... 398/164; 385/92; 364/777; 361/777
  See application file for complete search history.

(56) References Cited

U.S. PATENT DOCUMENTS

| 5,627,931 | A  | * | 5/1997  | Ackley et al. | 385/88   |
| 6,239,590 | B1 | * | 5/2001  | Krivy et al.  | 324/158.1 |
| 6,635,866 | B2 | * | 10/2003 | Chan et al.   | 250/239  |
| 6,656,646 | B2 | * | 12/2003 | Hotta et al.  | 430/5    |

\* cited by examiner

*Primary Examiner*—Jerry T Rahll

(57) ABSTRACT

A printed circuit board having a pattern of fiducial marks on opposed edges of the board for assuring accuracy and alignment of an electrical connector printed on the board. The fiducial marks are printed as staggered indicia extending orthogoral to the printed contact row array of the electrical connector so that when the board is cut or routed, an inspection process can determine if the physical edges of the board, which determine the pin alignment with a mating receptacle, are within specification.

18 Claims, 12 Drawing Sheets

|  | RIGHT SIDE | | | | | |
| --- | --- | --- | --- | --- | --- | --- |
|  | 0 | 1 | 2 | 3 | 4 | 5 |
| LEFT SIDE 0 | BAD | BAD | BAD | BAD | BAD | BAD |
| 1 | BAD | BAD | BAD | GOOD | GOOD | BAD |
| 2 | BAD | BAD | GOOD | GOOD | GOOD | BAD |
| 3 | BAD | GOOD | GOOD | OPTIMUM | GOOD | BAD |
| 4 | BAD | GOOD | GOOD | GOOD | BAD | BAD |
| 5 | BAD | BAD | BAD | BAD | BAD | BAD |

TABLE 1

FIG.5

| # OF MARKS | TOTAL WIDTH | METRIC DISTANCE TO THE LEFT EDGE | METRIC DISTANCE TO THE RIGHT EDGE | LEFT SIDE 0.1 | LEFT SIDE 0.1 | LEFT SIDE 0.05 | LEFT SIDE 0.05 | LEFT SIDE 14.5 | RIGHT MARK 14.5 | RIGHT MARK 0.05 | RIGHT MARK 0.05 | RIGHT MARK 0.1 | RIGHT MARK 0.1 |
|---|---|---|---|---|---|---|---|---|---|---|---|---|---|
| | | | | 1 | 2 | 3 | 4 | 5 | 5 | 4 | 3 | 2 | 1 |
| 4 | 29.10 | 0.85 | 0.45 | 0 | 0 | 0 | 1 | 1 | 1 | 1 | 0 | 0 | 0 |
| 4 | 29.10 | 0.90 | 0.40 | 0 | 0 | 1 | 1 | 1 | 1 | 0 | 0 | 0 | 0 |
| 4 | 29.10 | 0.80 | 0.50 | 0 | 0 | 0 | 0 | 1 | 1 | 1 | 1 | 0 | 0 |
| 5 | 29.15 | 0.90 | 0.45 | 0 | 0 | 1 | 1 | 1 | 1 | 1 | 0 | 0 | 0 |
| 5 | 29.15 | 0.85 | 0.50 | 0 | 0 | 0 | 1 | 1 | 1 | 0 | 1 | 0 | 0 |
| 5 | 29.20 | 0.80 | 0.60 | 0 | 0 | 0 | 0 | 1 | 1 | 1 | 1 | 0 | 0 |
| 5 | 29.20 | 1.00 | 0.40 | 0 | 1 | 1 | 1 | 1 | 1 | 0 | 0 | 1 | 0 |
| 6 | 29.20 | 0.90 | 0.50 | 0 | 0 | 0 | 1 | 1 | 1 | 1 | 1 | 0 | 0 |
| 6 | 29.25 | 0.85 | 0.60 | 0 | 0 | 0 | 1 | 1 | 1 | 1 | 1 | 1 | 0 |
| 6 | 29.25 | 1.00 | 0.45 | 0 | 1 | 1 | 1 | 1 | 1 | 1 | 0 | 0 | 0 |
| 7 | 29.30 | 0.90 | 0.60 | 0 | 0 | 1 | 1 | 1 | 1 | 1 | 1 | 1 | 0 |
| 7 | 29.30 | 1.00 | 0.50 | 0 | 1 | 1 | 1 | 1 | 1 | 1 | 1 | 0 | 0 |

TABLE 2

FIG.6

TOP VIEW OF BOARD

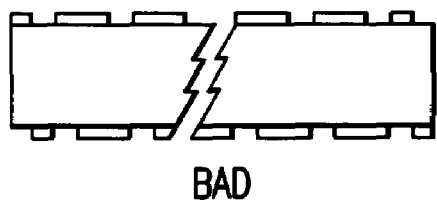 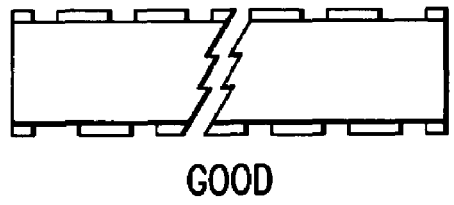
FIG.9(a) BAD  FIG.9(b) GOOD

FIDUCIAL MARKINGS FOR QUALITY VERIFICATION OF HIGH DENSITY CIRCUIT BOARD CONNECTORS

RELATED APPLICATIONS

This application is related to copending U.S. application Ser. No. 11/240,402 to Whitehead, filed simultaneously herewith.

BACKGROUND OF THE INVENTION

1. Field of the Invention

The inventions relates to electro-optic conversion modules, and particularly to the use of fiducial markings on such printed circuit board electrical connectors used in circuit boards for verification of printing alignment, and fabrication accuracy and quality control.

2. Description of the Related Art

Optical data transmission networks provide high capacity signal transmission without many of the physical limitations of electrical cables. Fiber-optic transceivers used in such networks convert electrical signals into optical signals and vice versa at the interface of a fiber-optic cable and an electronic network unit, such as a computer or communications system.

The typical hardware design of some transceivers provides the use of a printed circuit board that terminate on one side with a cut out pin edge or a contact array forming a multi-pin electrical connector, which may be implemented on one or both sides of the board. With such a contact array, the circuit boards can be directly plugged into a mating receptacle on the back end of the host computer. The cut out connector may also be elongated, and sized to be able to extend through open slots in the back face of the computer chassis so that connection may be made to a receptacle mounted inside the chassis on a mother board of the computer.

To extend the application of the fiber optic transceiver for mass-produced, low-cost computer and communications devices, it is desirable for the individual components to be economical to fabricate, and thus the electrical connector to be simple and reliable at the same time. A number of industry standards have been defined to integrate some of these electrical connector design considerations into opto-electronic transceiver modules. For example, the XENPAK standard (see www.xenpak) describes an advantageous opto-electronic electronic transceiver module package with a cut out printed circuit board electrical connector.

Like any lithographically printed circuit board, mask alignment and routing introduce variations from board to board that present issues of reliability and quality control, especially for high density pin configuration.

Prior to the present invention, there has not been a reliable process to ensure quality control in parallel optical module with a cut-out printed pin array electrical connector. Thus, it is desired to have a board design for the pin out making the electrical connection which can be easily checked to determine if it meets specification.

The novel features and characteristics of the invention are set forth in the appended claims. The invention itself, however, as well as other features and advantages thereof, will be best understood by reference to a detailed description of a specific embodiment, when read in conjunction with the accompanying drawings.

SUMMARY OF THE INVENTION

Briefly, and in general terms, the present invention provides a printed circuit board having a printed pattern of fiducial marks on a first side of the printed circuit board with a first sequence of spaced indicia parallel to a first edge of the board; and a second sequence of spaced indicia parallel to a second edge of the board opposite said first edge.

In another aspect, the present invention further provides a printed pattern of fiducial marks on a second side of the printed circuit board; including a third sequence of spaced indicia parallel to a first edge of the board, and a fourth sequence of spaced indicia parallel to a second edge of the board opposite said first edge.

In still another aspect, the present invention provides a planar circuit board having a first edge, a second edge opposite said first edge, and a third edge extending between said first and second edge; a printed circuit pattern imprinted on said circuit board including a plurality of connector contact areas extending along said third edge and a plurality of fiducial marks extending in a first row from said third edge along said first edge and in a second row from said third edge along said second edge.

In a further aspect, the present invention provides an optical transceiver for converting and coupling an information-containing electrical signal with an optical fiber having a housing including a fiber optic connector adapted for coupling with an external optical fiber for transmitting and/or receiving an optical communications signal; a rigid printed circuit board in the housing including a first edge forming a connector for coupling with an external electrical cable or information system device and for transmitting and/or receiving an information-containing electrical communications signal; and a pattern of fiducial marks on second and third opposed edges of said circuit board for assuring the accuracy and alignment of the electrical contacts of said connector.

In another aspect, the invention provides a method of qualifying the accuracy of a printed and cut printed circuit board by providing a printing mask pattern for a first side of the printed circuit board with a first sequence of a spaced indicia parallel to a first edge of the board; and a second sequence of spaced indicia parallel to a second edge of the board opposite said first edge; providing a printing mask pattern for a second side of the printed circuit board with a first sequence of spaced indicia parallel to a first edge of the board; and a second sequence of spaced indicia parallel to a second edge of the board opposite said first edge; printing a layer of visually conspicuous material on a printed circuit board using said mask pattern; determining the number of indicia printed on said first and second sides respectively of a printed board; and based upon such numerical determination against a predetermined qualification criteria, accepting or rejecting the board.

Some implementations of the present invention may incorporate or implement fewer of the aspects and features noted in the foregoing summaries.

BRIEF DESCRIPTION OF THE DRAWINGS

FIG. 5 is a table illustrating a typical evaluation criteria for specifying the quality of a printed circuit board based upon the number of fiducial marks appearing on the left and right edge of the board;

FIG. 6 is a more detailed table providing evaluation criteria for the specific example XENPAK board according to the preferred embodiment;

FIGS. 9a and 9b are cross-sectional view of two different production printed circuit boards.

DESCRIPTION OF THE PREFERRED EMBODIMENT

Figure 1:
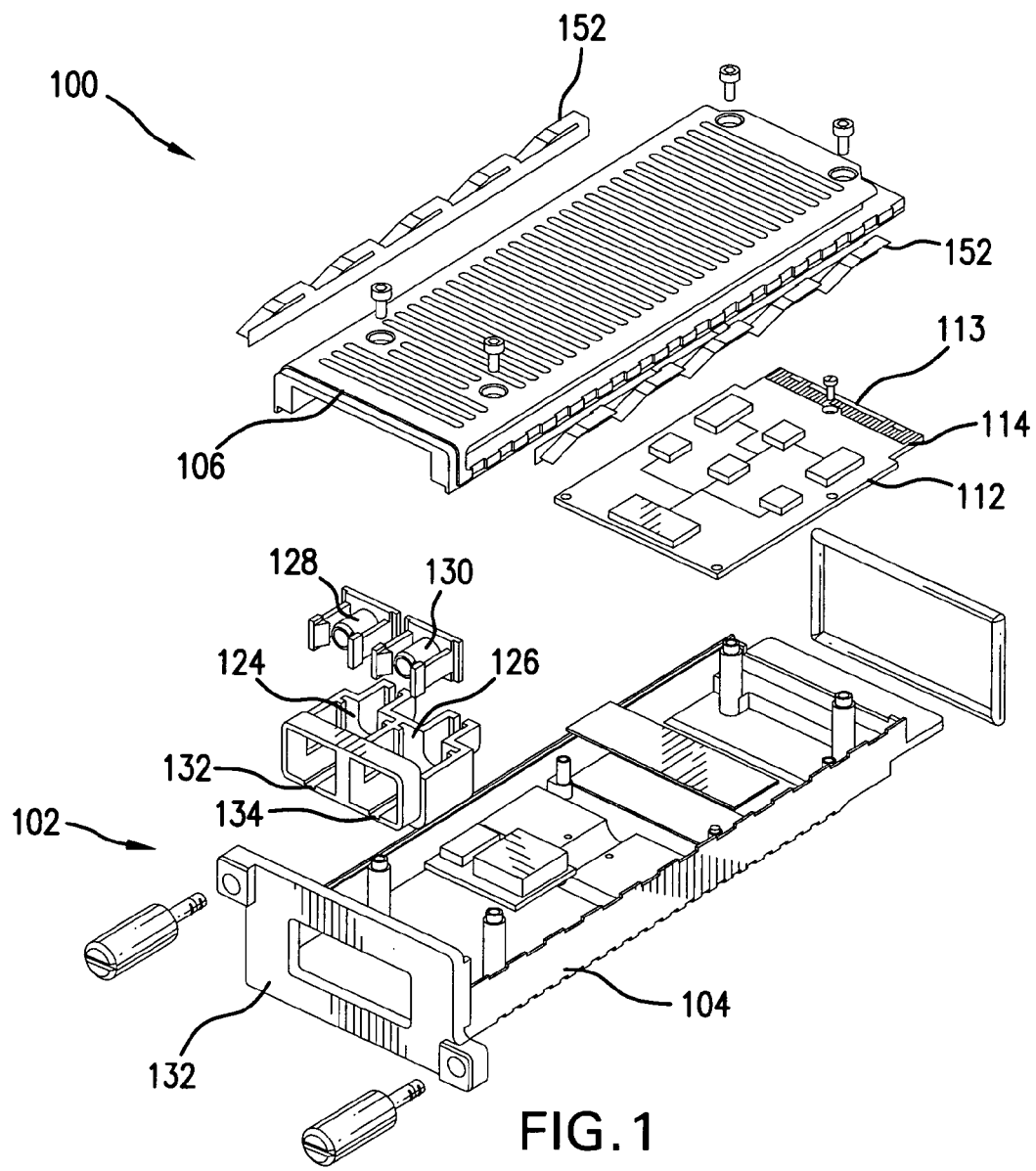
FIG. 1 is an exploded perspective view of an optical transceiver incorporating the cut out printed circuit board according to the present invention.

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments or the relative dimensions of the depicted elements, and are not drawn to scale.

FIG. 1 is an exploded perspective view of an optical transceiver 100 incorporating the cut out printed circuit board with fiducial marks according to the present invention. In this particular embodiment, the transceiver 100 is compliant with the IEEE 802.3ae 10GBASE-LX4 Physical Media Dependent sub-layer (PMD) and the XENPAK™ form factor. It is to be noted, however, that the transceiver 100 may be configured to operate under various other compliant protocols (such a Fibre Channel or SONET) and be manufactured in various alternate form factors such as X2. The transceiver 100 is preferably a 10 Gigabit Coarse Wavelength Division Multiplexed (CWDM) transceiver having four 3.125 Gbps distributed feedback lasers and provides 300 meter transmission over legacy installed multimode fiber and from 10 to 40 km over standard single mode fiber.

The transceiver 100 includes a two-piece housing 102 with a base 104 and a cover 106. In addition, contact strips 152 are provided to ground the module to chassis ground as well. The housing 102 is constructed of die-cast or milled metal, preferably die-cast zinc, although other materials also may be used, such a specialty plastics and the like. Preferably, the particular material used in the housing construction assists in reducing EMI. Further, EMI reduction may be achieved by using castellations (not shown) formed along the edges of the housing 102.

The front end of the transceiver 100 includes a faceplate 132 for securing a pair of receptacles 124, 126. The receptacles 124, 126 are configured to receive fiber optic connector plugs 128, 130. In the preferred embodiment, the connector receptacle 128, 130 are configured to receive an optical fiber with industry standard SC duplex connectors (not shown). As such, keying channels 132 and 134 are provided to ensure that the SC connectors are inserted in their correct orientation. Further, as shown in the exemplary embodiment and discussed further herein, the connector receptacle 126 receives and SC transmitting connector and the connector plug 124 receives an SC receiver connector.

In particular, the transceiver housing holds one or more circuit boards, including a transmit receive and a physical coding sub-layer subassemblies, and interface board 112, which is used to provide an electrical interface to external electrical systems (not shown).

The rear edge 113 of the board 112 includes a printed pattern of contact points 114 which form individual electrical connections to an external mating receptacle on the external system which the transceiver is associate with. The size and number of pins depends upon the particular standard. In the preferred embodiment, the 70 pm board edge connector as set forth in the XENPAK and X2 Multi-Source Agreements is depicted in FIGS. 7 and 8.

Figure 2:
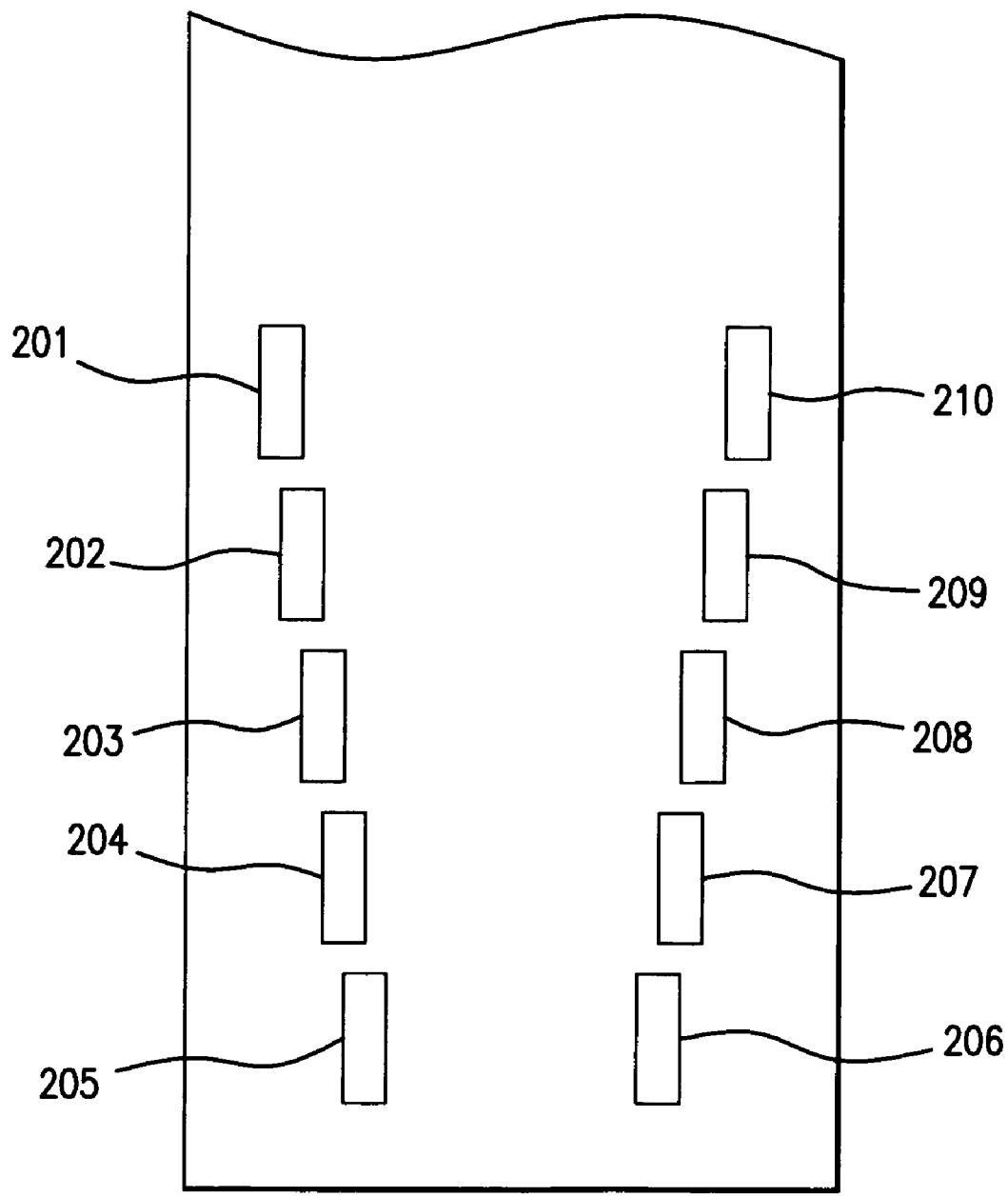
FIG. 2 is the mark pattern of fiducial indicia used for printing a printed circuit board according to the present invention.

FIG. 2 is the mark pattern of fiducial indicia 201 through 210 used for printing a single printed circuit board according to the present invention. In an actual production process, a number of identical printed circuit boards will be laid out in an array on a panel and printed simultaneously, as will be seen with reference to FIG. 3(b). After the single panel is printed, the individual boards are then separated or cut out with a router or other process equipment.

Figure 3A:
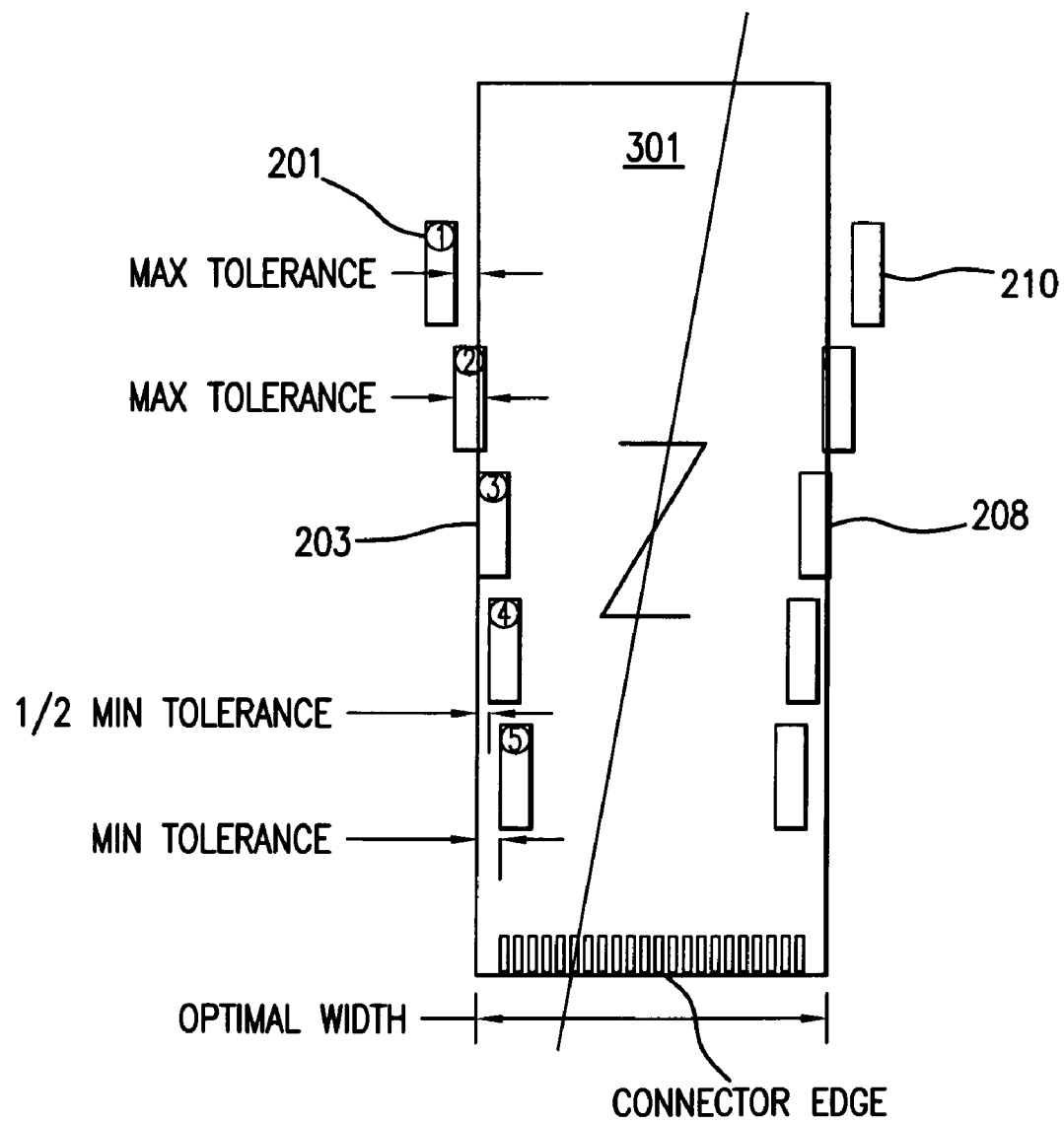
FIGS. 3a and 3b depict an overlay of the mark pattern of FIG. 2 over a portion of a printed circuit board which is sized with an optimum width in both single board and multiple board panel views respectively.

FIG. 3(a) depicts an overlay of the mark pattern of FIG. 2 over a printed circuit board 301 which is sized with an optimum width with respect to the pattern of fiducial marks, and routed with respect to the marks in a an optimum or ideal manner. In particular, the outside edges of marks 203 and 208 define the optimum or ideal width and the routing or cutting of the board or aligned and parallel to the outer edge of marks 203 and 208.

Figure 3B:
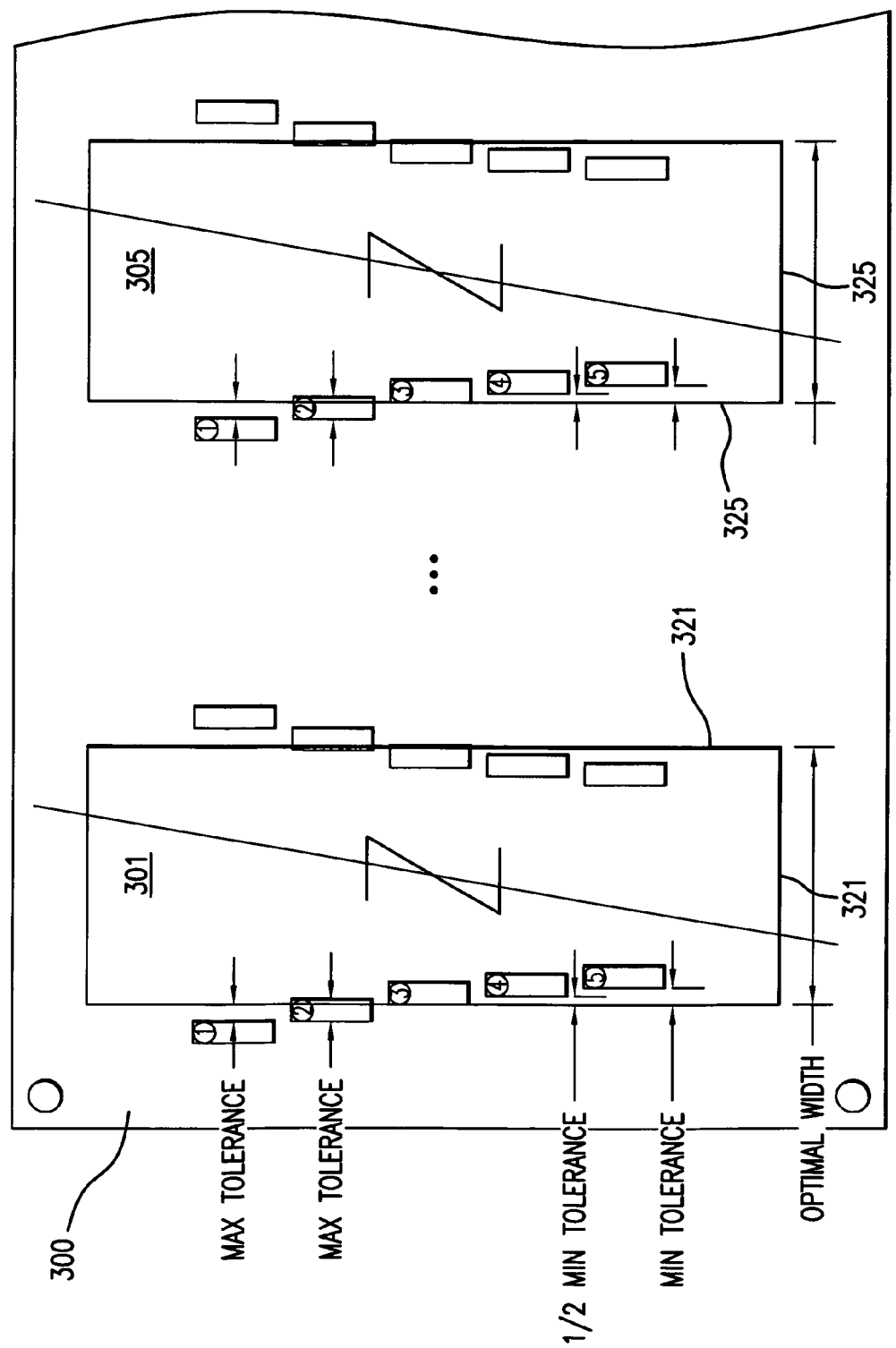

FIG. 3(b) depicts a printed circuit panel 300 from which individual printed circuit boards 301, 305, etc. are routed or cut along lines 321, 325, etc. It is seen that the masking pattern depicted in FIG. 2 overlies the size of a single board, with the more extreme marks 201 or 210 being printed on the panel portion which is normally cut away.

Figure 4C:
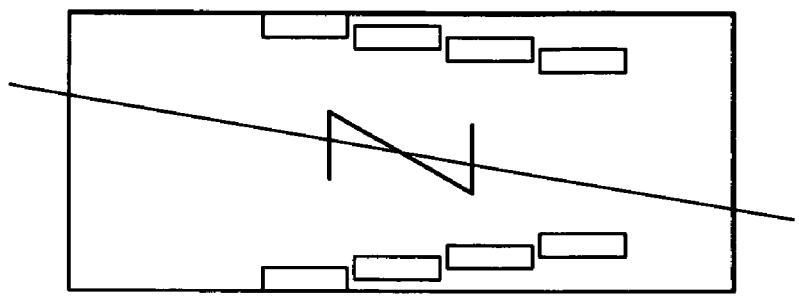
FIGS. 4a, 4b and 4c depict these different production printed circuit boards with different patterns of fiducial indicia present on them.
Figure 4B:
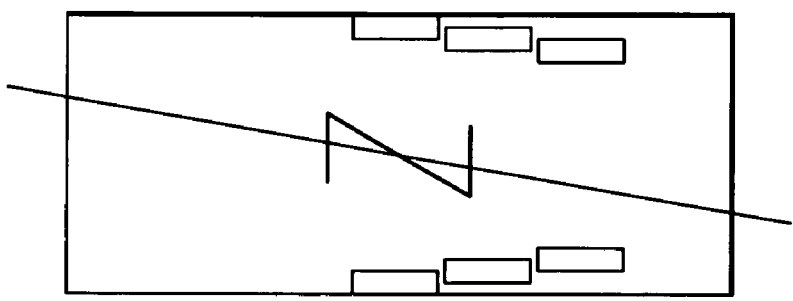
Figure 4A:
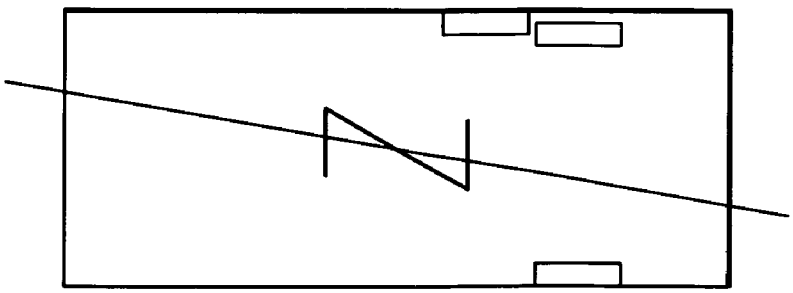

FIGS. 4a, 4b and 4c depict three different specimens of production printed circuit boards with different fiducial indicia present on them as illustrative examples of different printing patterns which may be printed as a result of differences in alignment or routing of the individual boards during a production process.

FIG. 5 is a table illustrating the evaluation criteria for specifying the quality of a printed circuit board based upon the number of fiducial marks appearing on the left and right edge of the board as determined from human visual or automated computer inspection process. In this particular example, the criteria rates the board as either optimum, good or bad.

FIG. 6 is a more detailed table providing a more detailed evaluation of the optimum or good boards for the specific dimensions of the XENPAK X2 specification. The fiducial marks are numbered 1 through 5 with the 5 mark closest to the pin connector edge of the board. In each row, the digit 1 in the row represents the presence of the specifically numbered mark on the sample board defined by the row, and the digit 0 in the row represents the absence of a board with marks 4 and 5 on the left side, and 4 and 5 on the right side, for a total of four marks, as noted in column 1. The width of the board is then determined in column 2, and the distances to the left and right edges of the board set forth in column 3 and 4 respectively.

Figure 7A:
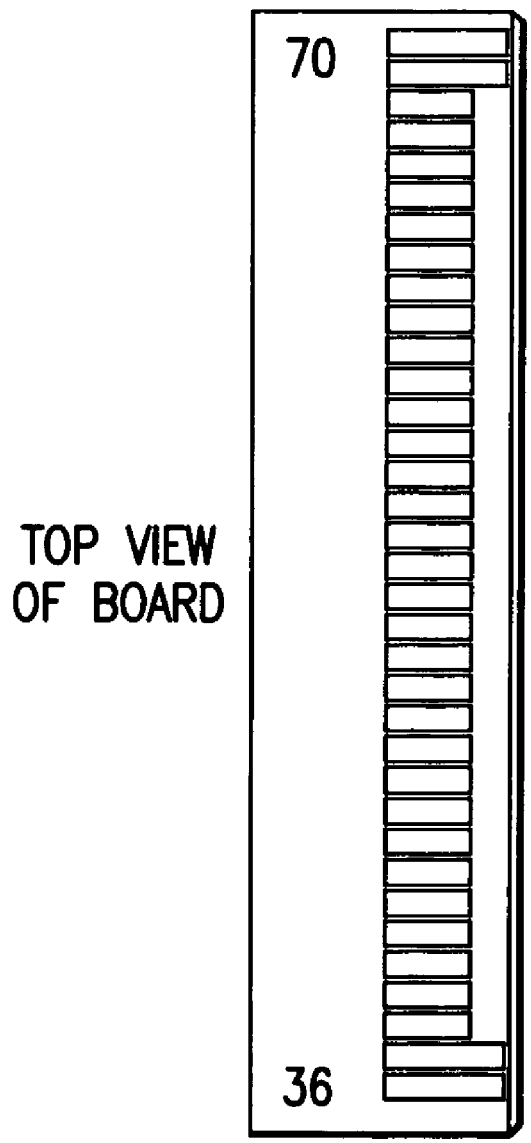
FIGS. 7a, 7b and 7c are printed circuit board connector specifications according to the XENPAK standard.
Figure 7C:
Figure 7B:
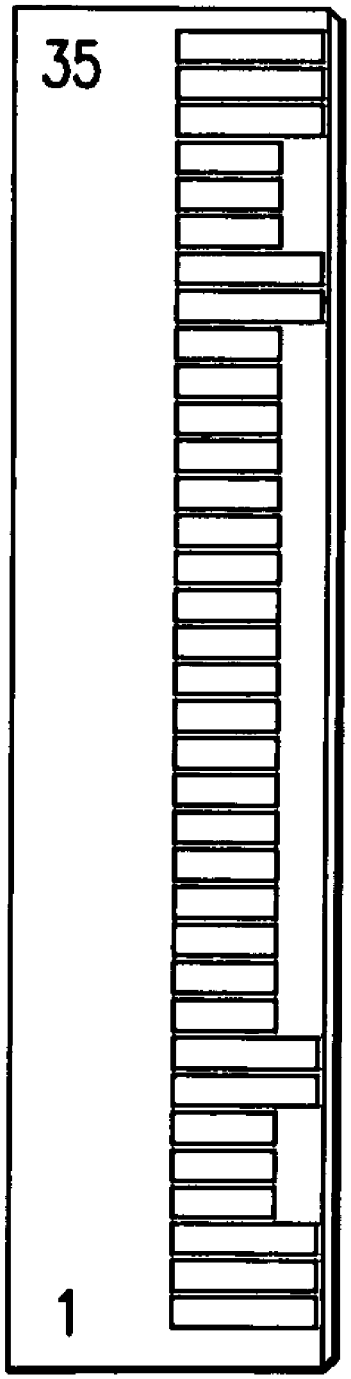

FIGS. 7a, 7b, and 7c are printed circuit board connector specifications according to the XENPAK standard.

Figure 8A:
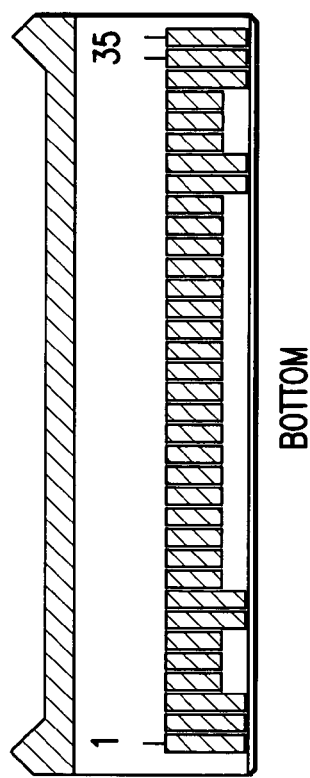
FIGS. 8a and 8b are enlarged top and bottom plan view respectively of the printed circuit board connector of FIG. 7.
Figure 8B:
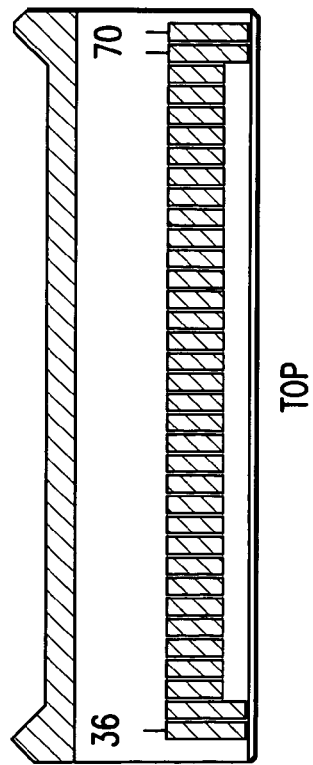

FIGS. 8a and 8b are enlarged top and bottom plan views respectively of the printed circuit board connector of FIG. 7.

FIGS. 9a and 9b are cross-sectional views of two different production printed circuit boards to illustrate how the printing on the first and second sides of the board may result in a relative misalignment of the pin patterns on the top and bottom. In the examples illustrated, note the metallization on the left hand edge on both the top and bottom of the board. In the FIG. 9(a) production specimin, the metallization does not extend to the edge. Thus, the unit of FIG. 9(a) is misaligned and should be rejected, while the unit of FIG. 9(b) is acceptable.

Figure 10:
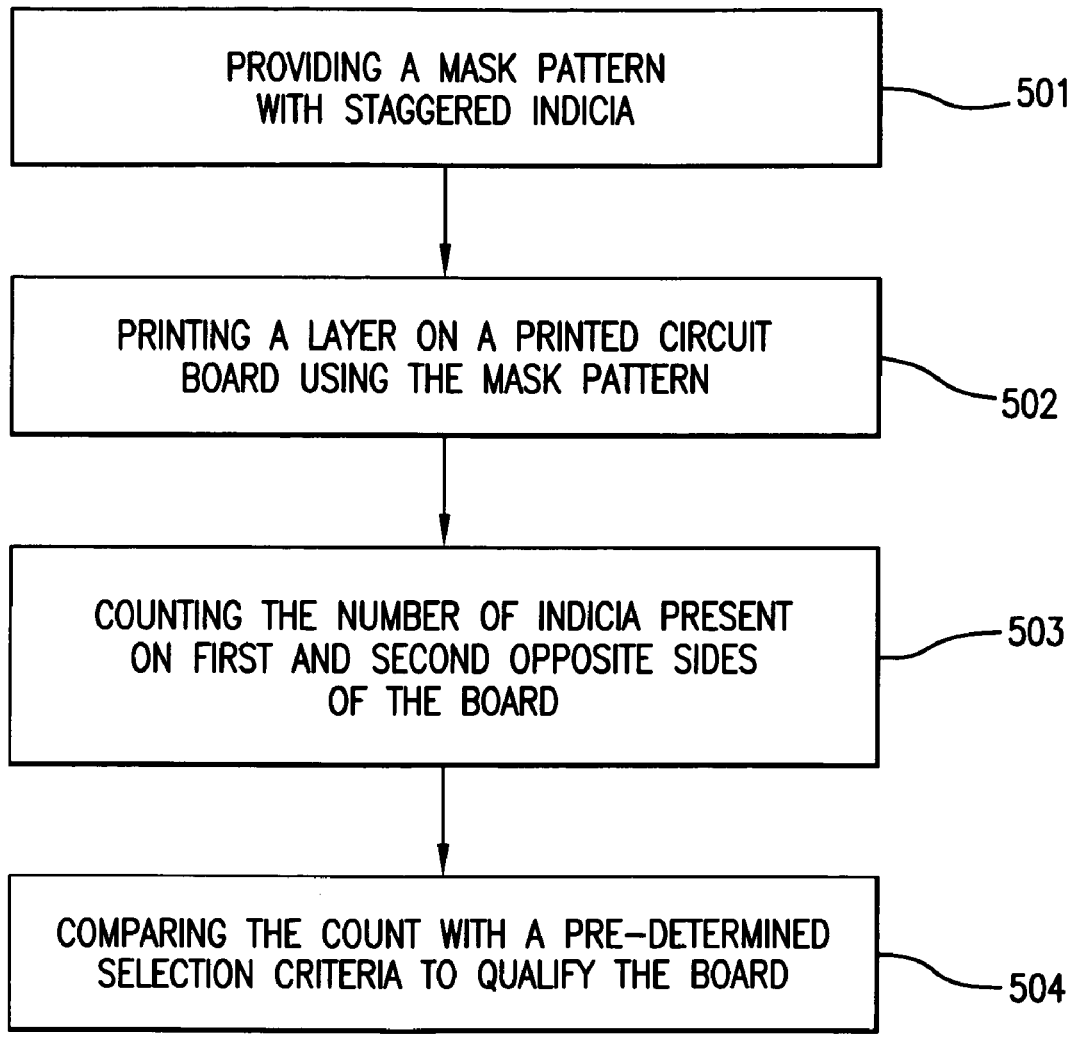
FIG. 10 is a flow chart depicting the method of using the fiducial marks according to the present invention in a quality control protocol.

FIG. 10 is a flow chart depicting the method of using the fiducial marks according to the present invention in a quality control protocol.

In the highly simplified method, the first step 501 is to provide a mask pattern with fiducial marks on indicia that are arrayed in parallel in a staggered sequence of steps diverging away from the edge where the pin contacts are to be printed.

In the next step 502, a layer is printed on the printed circuit board (or on the panel of several boards) including the fiducial marks. Typically, the fiducial marks may be the same metal layer as the pin contacts, so only a single print step is involved for each side of the board. Following printing, the individual boards may be separated or routed from the panel.

The next step 503 is to count the indicia on the first and second opposite edges of the board, on each side, and to utilize those numbers in the next step 504 to qualify the board.

What is claimed is:

1. A printed circuit board comprising:
   a plurality of printed connector contact areas disposed along a third edge of the printed circuit board for coupling to an external electrical connector, the connector contact areas disposed on a first side and a second side of the printed circuit board;
   a first printed pattern of fiducial marks on the first side of the printed circuit board including a first sequence of spaced indicia located directly adjacent to and extending parallel to a first edge of the board, and a second sequence of spaced indicia located directly adjacent to and extending parallel to a second edge of the board opposite said first edge, said spaced indicia of each sequence being arranged along corresponding board edges with a distance measured perpendicular to the board edges between corresponding edges of adjacent indicia of the sequences parallel to and facing the respective board edges equal to a different tolerance fraction so that after the cutting or routing of the board and the formation of the first and second edges, the accuracy of the cutting or routing as determined by the location of each edge with respect to the connector contact areas on the first side of the printed circuit board and the width of the printed circuit board is commensurately defined by the number of fiducial marks of the first printed pattern physically present and remaining along the respective edges whereby the quality acceptability of the board is functionally determined by a predetermined range in the number of fiducial marks of the first printed pattern along such respective edges;
   a second printed pattern of fiducial marks on the second side of the printed circuit board including a third sequence of spaced indicia parallel to the first edge of the board, and a fourth sequence of spaced indicia parallel to the second edge, the accuracy of the cutting or routing being determined by the location of each edge with respect to the connector contact areas on the second side of the printed circuit board and the width of the printed circuit board is commensurately defined by the number of fiducial marks of the second printed pattern physically present and remaining along the respective edges of the second side of the printed circuit board.

2. A printed circuit board as defined in claim 1, wherein the first and second sequences of spaced indicia each include a plurality of spaced-apart rectangles aligned in a diagonal configuration.

3. A printed circuit board as defined in claim 2, wherein the adjacent spaced-apart rectangles overlap along a longitudinal axis that extends perpendicular to the third edge.

4. A printed circuit board as defined in claim 1, wherein the spaced indicia are spaced at a monotonically changing distance from the adjacent edge of the board.

5. A printed circuit board as defined in claim 1, wherein the printed circuit board is a component of an optical transceiver and is positioned within a housing that includes a fiber optic connect adapted for coupling with an external optical fiber for transmitting and/or receiving an optical communications signal, the optical transceiver configured to convert and couple an information-containing electrical signal with an optical fiber.

6. A printed circuit board as defined in claim 1, wherein the first and second sequences of spaced indicia are identical.

7. A planar circuit board having a first edge, a second edge opposite said first edge, and a third edge extending between said first and second edge; and
   a printed circuit pattern imprinted on said circuit board including a plurality of printed connector contact areas extending along said third edge for coupling to an external electrical connector and a first plurality of fiducial marks extending from said third edge along and located directly adjacent to said first edge and a second plurality of fiducial marks extending from said third edge and located directly adjacent said second edge, the first and second plurality of marks each including at least three marks with the same shape aligned in a diagonal orientation that angle outward from a centerline of the circuit board and away from the third edge with each mark spaced at a different relative distance from the corresponding edge, said plurality of fiducial marks being arranged along corresponding board edges with a distance measured perpendicular to the board edges between corresponding edges of adjacent indicia of the sequences parallel to and facing the board edges equal to a different tolerance fraction so that after the cutting or routing of the board and the formation of the first and second edges the accuracy of the cutting or routing as determined by the location of each edge with respect to the connector contact areas and the width of the printed circuit board is commensurately defined by the number of fiducial marks physically present and remaining along the respective edges whereby the quality acceptability of the board is functionally determined by a predetermined range in the number of fiducial marks along such respective edges.

8. A planar printed circuit board as defined in claim 7, wherein the printed circuit pattern has a predetermined specified width between said first and second edge, and the pattern of fiducial marks is defined by a mask pattern that extends beyond said specified width so that an optimally dimensional circuit board has a number of fiducial marks that is smaller than the number of fiducial marks on the mask.

9. A planar printed circuit board as defined in claim 8, wherein the specification for a properly printed and routed board has a number of fiducial marks extending along said first and second edges respectively that is greater than a first predetermined integer and less than a second predetermined integer.

10. A printed circuit board as defined in claim 7, further comprising a printed pattern of fiducial marks on a second side of the printed circuit board including a third sequence along the first edge and a fourth sequence along the second edge.

11. A printed circuit board as defined in claim 7, wherein each of the fiducial marks includes a rectangular shape with a major axis parallel to the first and second sides.

12. A printed circuit board as defined in claim 7, wherein the first and second plurality of marks are substantially identical.

13. A printed circuit board as defined in claim 7, wherein the printed circuit board is a component of an optical transceiver configured to convert and couple an information-containing electrical signal with an optical fiber.

14. An optical transceiver for converting and coupling an information-containing electrical signal with an optical fiber comprising:
   a housing including a fiber optic connect adapted for coupling with an external optical fiber for transmitting and/or receiving an optical communications signal;
   a rigid printed circuit board in the housing including an edge with a plurality of printed connector contact areas forming a connector for coupling with an external electrical cable or information system device and for transmitting and/or receiving an information-containing electrical communications signal; and
   a respective pattern of fiducial marks on first and second opposed edges of said circuit board, said pattern of fiducial marks being located directly adjacent to and extending along the opposing edges with a distance measured perpendicular to the board edges between corresponding edges of adjacent indicia of the sequences parallel to and facing the board edges equal to a different tolerance fraction so that after the cutting or routing of the board and the formation of the first and second edges the accuracy of the cutting or routing as determined by the location of each edge with respect to the connector and the width of the printed circuit board is commensurately defined by the number of fiducial marks physically present and remaining along the respective edges whereby the quality acceptability of the board is functionally determined by a predetermined range in the number of fiducial marks along such respective edges.

15. An optical transceiver as defined in claim 14, wherein the first and second sequences of spaced indicia are identical.

16. An optical transceiver as defined in claim 14, wherein the first and second sequences of spaced indicia each include a plurality of spaced-apart rectangles aligned in a diagonal configuration.

17. An optical transceiver as defined in claim 14, wherein the adjacent spaced-apart rectangles overlap along a longitudinal axis that extends perpendicular to the third edge.

18. An optical transceiver as defined in claim 14, wherein the first and second plurality of marks each include at least three marks with the same shape aligned in a diagonal orientation that angle outward from a centerline of the circuit board and away from the third edge.

* * * * *

UNITED STATES PATENT AND TRADEMARK OFFICE
CERTIFICATE OF CORRECTION

PATENT NO. : 7,614,800 B2  Page 1 of 1
APPLICATION NO. : 11/240402
DATED : November 10, 2009
INVENTOR(S) : Edmond Warming Lau, Xiaozhong Wang and Robert Lewis Mosebar It is certified that error appears in the above-identified patent and that said Letters Patent is hereby corrected as shown below:

On the Title Pg, Item (57) Abstract, line 5, change "orthogoral" to --orthogonal--.
Column 1, line 8, change "11/240,402" to --11/240,400--; line 14, change "inventions" to --invention--.
Column 3, line 38, change "a" to --as--; line 51, change "a" to --as--; line 60, change "receptacle" to --receptacles--; line 60, change "128, 130" to --124, 126--; line 66, change first "and" to --an--; line 66, change "plug" to --receptacle--.
Column 4, line 9, change "associate" to --associated--; line 25, delete "a"; line 28, change "or" to --is--.
Column 5, line 5, change "specimin" to --specimen--.

Signed and Sealed this

Thirteenth Day of July, 2010

David J. Kappos
*Director of the United States Patent and Trademark Office*